United States Patent
Ryskoski

(10) Patent No.: US 6,799,311 B1
(45) Date of Patent: Sep. 28, 2004

(54) BATCH/LOT ORGANIZATION BASED ON QUALITY CHARACTERISTICS

(75) Inventor: Matthew Ryskoski, Kyle, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/183,265

(22) Filed: Jun. 27, 2002

(51) Int. Cl.[7] .......................... G06F 17/50; G01R 31/26
(52) U.S. Cl. ................... 716/19; 716/4; 438/14
(58) Field of Search ................... 716/46; 714/48; 702/84; 700/121, 110; 73/105; 51/307; 451/41; 438/14; 356/446, 237.5; 324/709, 464; 29/25.01; 250/310, 307

(56) References Cited

U.S. PATENT DOCUMENTS

| | | | | |
|---|---|---|---|---|
| 6,248,602 B1 | * | 6/2001 | Bode et al. | 438/14 |
| 6,303,398 B1 | * | 10/2001 | Goerigk | 438/14 |
| 6,303,931 B1 | * | 10/2001 | Menaker et al. | 250/307 |
| 6,405,144 B1 | * | 6/2002 | Toprac et al. | 702/84 |
| 6,427,093 B1 | * | 7/2002 | Toprac | 700/121 |
| 6,449,524 B1 | * | 9/2002 | Miller et al. | 700/121 |
| 6,456,894 B1 | * | 9/2002 | Nulman | 700/121 |
| 6,587,744 B1 | * | 7/2003 | Stoddard et al. | 700/121 |
| 6,599,763 B1 | * | 7/2003 | Reyes et al. | 438/14 |
| 2001/0039462 A1 | * | 11/2001 | Mendez et al. | 700/45 |
| 2002/0085212 A1 | * | 7/2002 | Campbell et al. | 356/600 |

* cited by examiner

*Primary Examiner*—Matthew Smith
*Assistant Examiner*—Helen Rossoshek
(74) *Attorney, Agent, or Firm*—Williams, Morgan & Amerson, P.C.

(57) ABSTRACT

A method and an apparatus for performing a batch organization of semiconductor wafers. Data relating to metrology data associated with a processed semiconductor wafer in a lot is acquired. A quality characteristic associated with the processed semiconductor wafer is determined based upon the metrology data. A plurality of semiconductor wafers associated with the lot re-organized for subsequent processing, based upon the quality characteristic.

34 Claims, 9 Drawing Sheets

BATCH/LOT ORGANIZATION BASED ON QUALITY CHARACTERISTICS

BACKGROUND OF THE INVENTION

1. Field of the Invention

This invention relates generally to semiconductor manufacturing, and, more particularly, to a method and apparatus for re-organizing a batch or lot of semiconductor wafers based on quality characteristics and/or yield characteristics.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed across a group of semiconductor wafers, sometimes referred to as a lot. For example, a process layer that may be composed of a variety of different materials may be formed across a semiconductor wafer. Thereafter, a patterned layer of photoresist may be formed across the process layer using known photolithography techniques. Typically, an etch process is then performed across the process layer using the patterned layer of photoresist as a mask. This etching process results in the formation of various features or objects in the process layer. Such features may be used as, for example, a gate electrode structure for transistors. Many times, trench isolation structures are also formed across the substrate of the semiconductor wafer to isolate electrical areas across a semiconductor wafer. One example of an isolation structure that can be used is a shallow trench isolation (STI) structure.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The semiconductor wafer 105 typically includes a plurality of individual semiconductor die 103 arranged in a grid 150. Using known photolithography processes and equipment, a patterned layer of photoresist may be formed across one or more process layers that are to be patterned. As part of the photolithography process, an exposure process is typically performed by a stepper on approximately one to four die 103 locations at a time, depending on the specific photomask employed. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer.

Turning now to FIG. 2, a typical flow of processes performed on a semiconductor wafer 105 by a semiconductor manufacturing system is illustrated. The manufacturing system processes at least the portion of a lot of semiconductor wafers 105 (block 210). Upon processing the semiconductor wafers 105, the manufacturing system may acquire metrology data regarding the processed semiconductor wafers 105 (block 220). The manufacturing system may then analyze the metrology data to detect errors associated with the processing of the semiconductor wafers (block 230). Generally, the manufacturing system then makes a determination whether there are subsequent semiconductor wafers 105 to be processed in the lot (block 240). If the manufacturing system determines that there are additional semiconductor wafers 105 in the lot to be processed, the wafers from a next set or next portion of the lot are processed and the acquisition of metrology data is then repeated (block 250). When the manufacturing system makes a determination that there are no additional semiconductor wafers 105 to be processed in the lot, the manufacturing system prepares to process the next lot of semiconductor wafers 105 (block 260).

Among the problems associated with the current methodology include the uniform characterization of the semiconductor wafers 105 as they are processed throughout a manufacturing facility. In other words, semiconductor wafers 105 within a lot are generally processed in a similar fashion because they are generally characterized uniformly. This methodology may not take into account inherent variations relating to the effects of processing the semiconductor wafers 105, which may cause different semiconductor wafers 105 to have different characteristics, such as different temperature reactions on different semiconductor wafers 105. Many times a few semiconductor wafers 105 with poor characteristics may cause the overall average of a parameter associated with a particular characteristic to degrade to the point that the few good semiconductor wafers 105 surrounded by sub par semiconductor wafers 105 may become over-compensated or over-corrected (e.g., some semiconductor wafers 105 being over-polished because the average thickness was calculated to be tool high). Over-compensating/over-correcting generally refers to a semiconductor wafer 105 being subjected to compensation processes due to the fact that a control system mistakenly perceives that there are large errors present on the semiconductor wafer 105.

For example, if a small percentage of a lot of semiconductor wafers 105 are determined to have, for example, a gate insulation layer that has an out-of-tolerance thickness, then the entire lot of semiconductor wafers 105 may be correlated to a particular electrical characteristic. However, the semiconductor wafers 105 in the lot that have gate insulation layers of the proper thickness may be unnecessarily subjected to compensation processes due to the fact that a larger number of semiconductor wafers 105 in the lot may have a large or an excessively small film-thickness value. Generally, an average is calculated for the particular lot and compensation or correction is made in response to the average calculation. This may cause the properly processed semiconductor wafers 105 to be undesirably subjected to correction processes or procedures that are not necessary for the properly processed semiconductor wafers 105. In turn, this causes further inefficiency in the processing of semiconductor wafers 105.

The present invention is directed to overcoming, or at least reducing, the effects of, one or more of the problems set forth above.

SUMMARY OF THE INVENTION

In one aspect of the present invention, a method is provided for performing a batch organization of semiconductor wafers. Metrology data associated with a processed semiconductor wafer in a lot is acquired. A quality characteristic associated with the processed semiconductor wafer is determined based upon the metrology data. A plurality of semiconductor wafers associated with the lot are re-organized for subsequent processing, based upon the quality characteristic.

In another aspect of the present invention, a system is provided for performing a batch organization of semiconductor wafers. The system of the present invention comprises a processing tool to process semiconductor wafers. The system also comprises a process controller operatively coupled to the processing tool, the process controller controls operations of the processing tools and performs a wafer reorganization process, the wafer reorganization process comprises determining a quality characteristic associated with the semiconductor wafers and re-arranging a sequence of the semiconductor wafers to be processed based upon the quality characteristic.

In another aspect of the present invention, an apparatus is provided for performing a batch organization of semiconductor wafers. The apparatus of the present invention comprises a process controller, the process controller to control operations of at least one processing tool and perform a wafer reorganization process, the wafer reorganization process comprises determining a quality characteristic associated with the semiconductor wafers and re-arranging a sequence of the semiconductor wafers to be processed based upon the quality characteristic.

In yet another aspect of the present invention, a computer readable program storage device encoded with instructions is provided for performing a batch organization of semiconductor wafers. The computer readable program storage device encoded with instructions when executed by a computer acquires metrology data associated with a processed semiconductor wafer 105 in a lot, determines a quality characteristic associated with the processed semiconductor wafer 105 based upon the metrology data and re-organizes a plurality of semiconductor wafers 105 associated with the lot for subsequent processing based upon the quality characteristic.

BRIEF DESCRIPTION OF THE DRAWINGS

The invention may be understood by reference to the following description taken in conjunction with the accompanying drawings, in which like reference numerals identify like elements, and in which.

Figure 1:
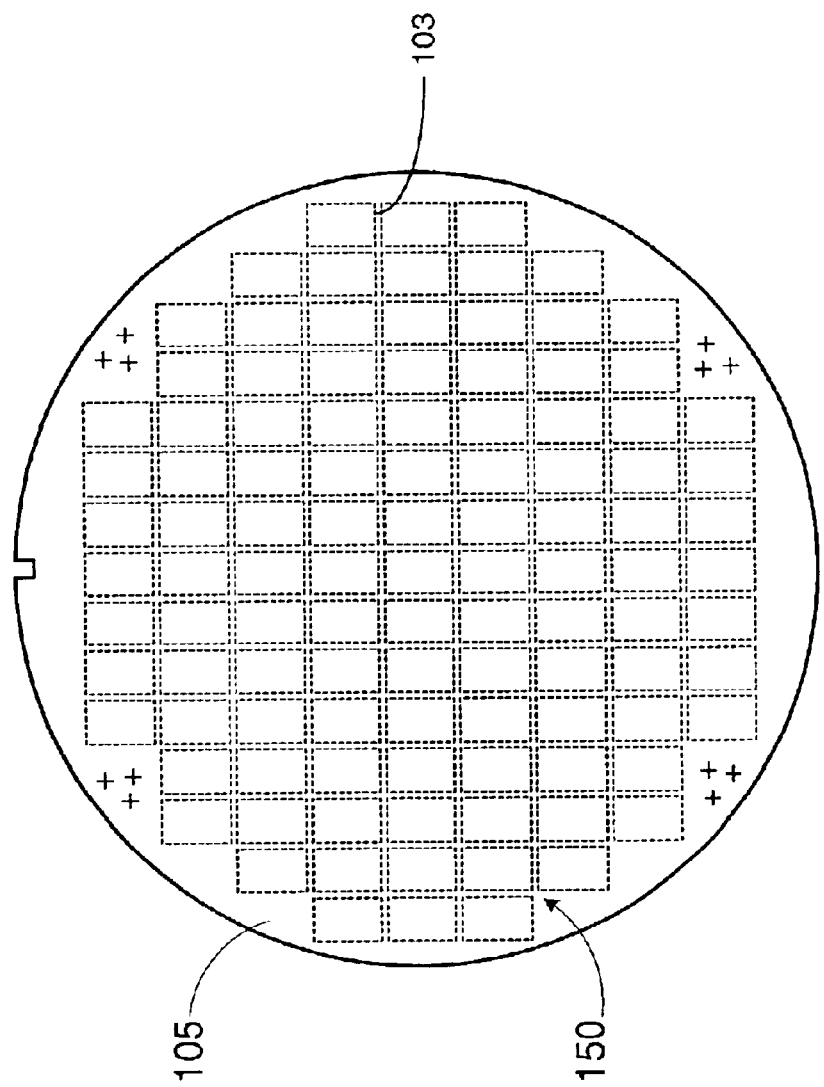
FIG. 1 is a simplified diagram of a prior art semiconductor wafer being processed.
Figure 2:
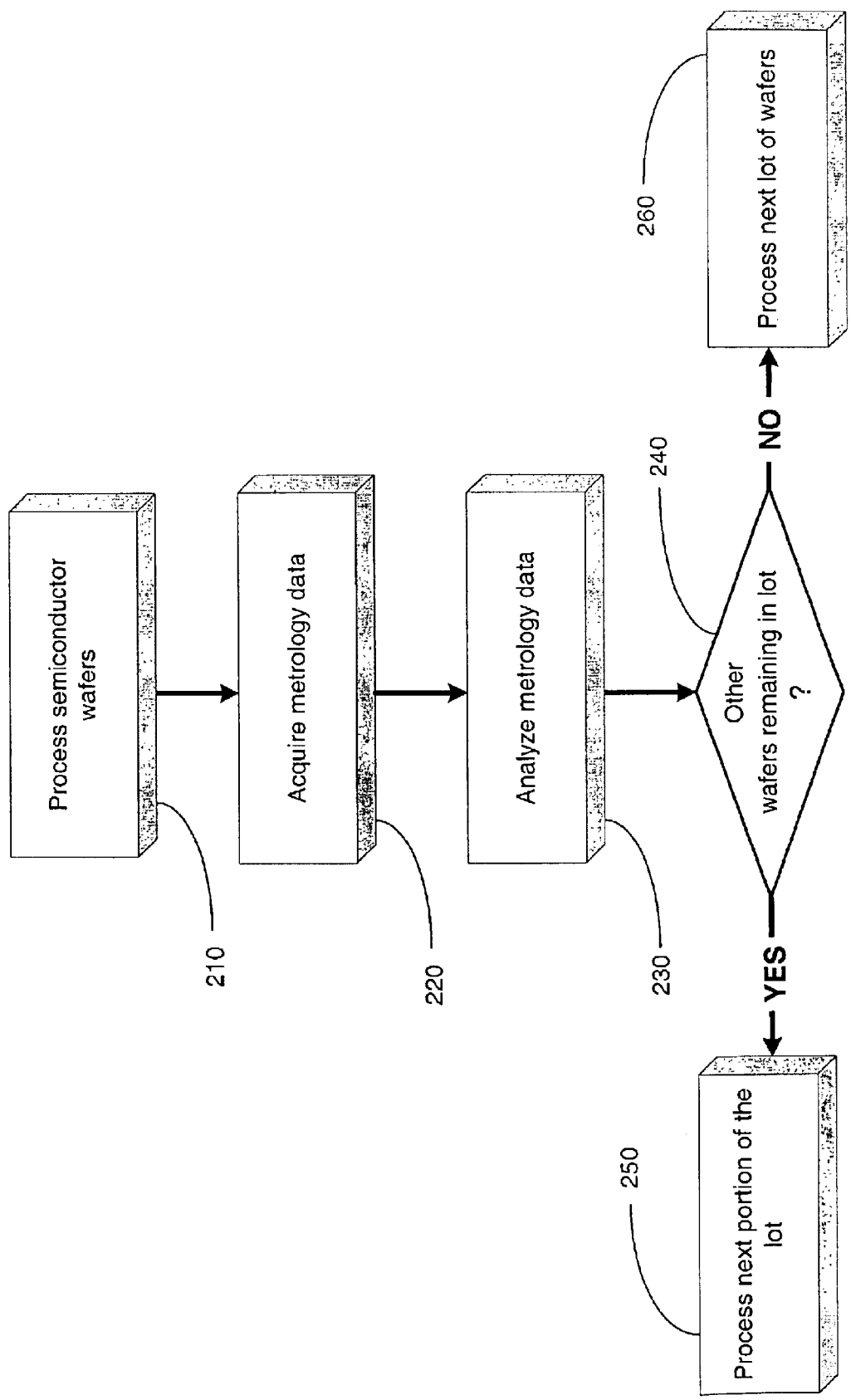
FIG. 2 illustrates a simplified flowchart depiction of a prior art process flow during manufacturing of semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Embodiments of the present invention provide for reorganizing semiconductor wafers 105 within a manufacturing lot/batch based upon quality characteristics and/or quality predictions relating to the semiconductor wafers 105. Embodiments of the present invention also provide for organizing semiconductor wafers 105 between a plurality of lots such that a selection of semiconductor wafers 105 may be grouped to create a new lot of semiconductor wafers 105. The new lot of semiconductor wafers 105 may contain selected semiconductor wafers 105 that exhibit similar or related quality characteristics. As a result, such semiconductor wafers 105 may be more accurately and efficiently processed.

The selection of semiconductor wafers 105 from a plurality of lots may be made using one or more wafers-analysis techniques, such as analysis of the potential yield of a particular semiconductor wafer 105, analysis of a probable grade (e.g., speed of operation), and the like. Using embodiments of the present invention, semiconductor wafers 105 with higher quality-characteristics may be selected and processed such that increased yields and/or better performance of devices ultimately manufactured from the semiconductor wafers 105 may be realized.

Figure 3:
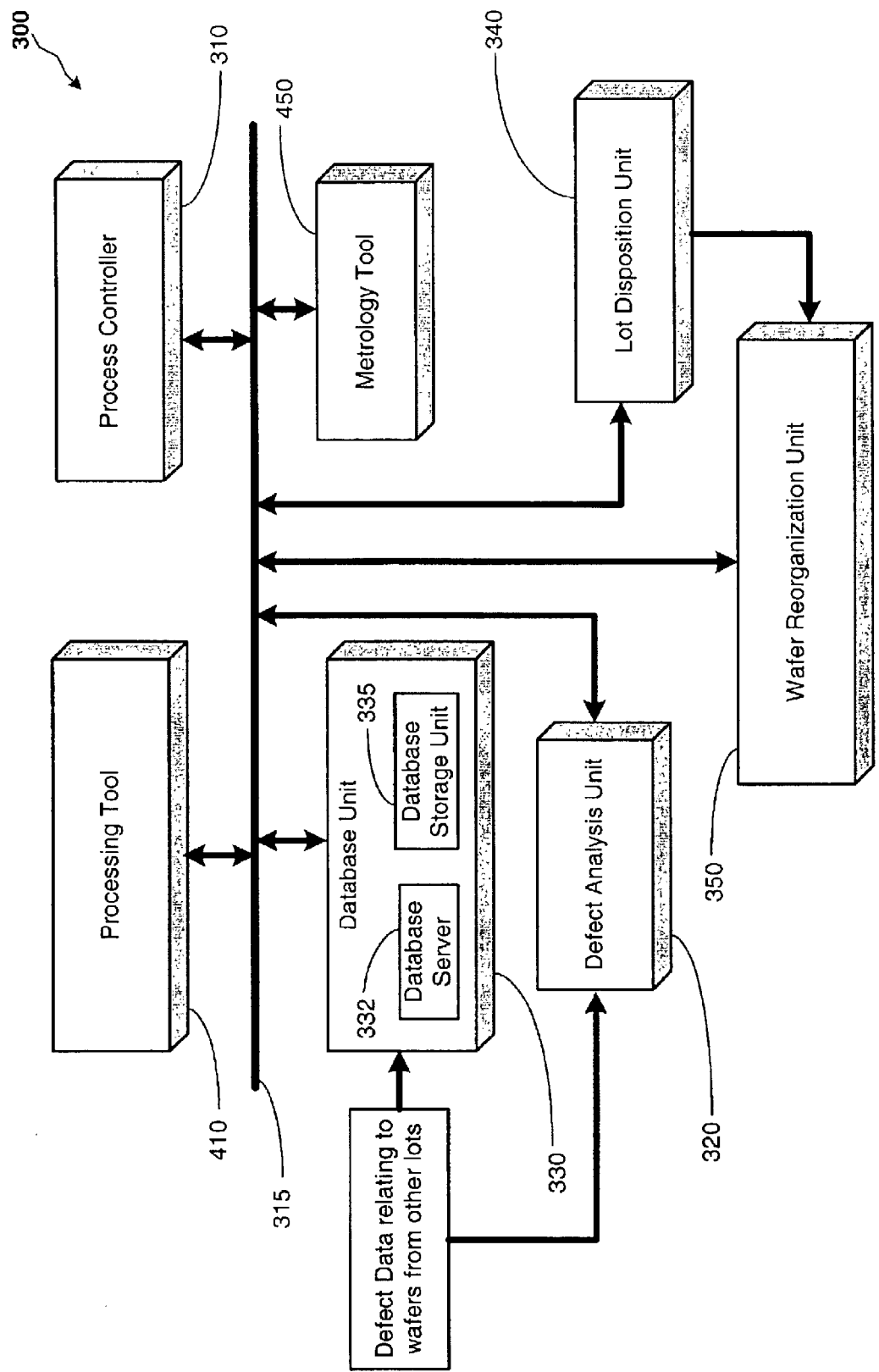
FIG. 3 is a block diagram representation of a system in accordance with one illustrative embodiment of the present invention.

Turning now to FIG. 3, a block diagram depiction of a system 300, in accordance with illustrative embodiments of the present invention, is provided. The system 300 comprises a processing tool 410 that is capable of processing a plurality of semiconductor wafers 105. A process controller 310 generally controls the operations of the processing tool 410. The system 300 also comprises a metrology tool 450 capable of acquiring metrology data, which may include defect data, related to the processed semiconductor wafers 105. The system 300 further comprises a database unit 330 that may store metrology data (e.g., defect data) related to the processed semiconductor wafers 105 in other lots, metrology data acquired by the metrology tool 450, and/or defect data relating to processed semiconductor wafers 105 processed by the processing tool 410. The database unit 330 may comprise a database server 332 for storing data related to the processed semiconductor wafers 105 into a database storage unit 335.

A defect analysis unit 320 is capable of analyzing the metrology data acquired by the metrology tool 450 and determining or calculating defects that may exist on the processed semiconductor wafers 105. A lot disposition unit 340 in the system 300 is capable of examining defect data and/or other information relating to processed semiconductor wafers 105 in a lot, and ranking the semiconductor wafers 105 according to one of a plurality of characteristics, such as potential yield characteristics, grade parameter characteristics, various electrical characteristics, reliability characteristics, process-ability characteristics, and the like. Other quality characteristics known to those skilled in the art having the benefit of the present disclosure may be used to rank semiconductor wafers 105 in a batch or lot.

Exemplary quality characteristic include, but are not limited to, an estimated yield parameter, an estimated grade parameter associated with a device manufactured from a processed semiconductor wafer 150 (e.g., estimated maximum clock speed of the operation of the device), an estimated power consumption parameter, a film resistivity parameter, a film capacitance parameter, a defect density parameter, a feature dimension parameter, etc. Some quality characteristics may correspond to metrology data that is gathered after subsequent processing steps. Such a quality characteristic may be utilized in estimating the value of a corresponding parameter prior to measuring that parameter. For example, electrical parameters such as resistivity, speed, or power consumption, may be estimated during an early time period of a processing cycle, while actual measurements of the electrical parameters may be performed at a later time period of the processing cycle. After such definitive measurements, the quality characteristic may be replaced with the actual measured parameter.

Using the estimated and/or actual quality characteristics, a quality profile relating to one of more semiconductor wafers 105 may be generated on a wafer-by-wafer basis. The quality profile may be stored in the database unit 330. The quality profile and accompanying quality characteristics of particular semiconductor wafers 105 or lot may change during the processing cycle. For example, deposition tools typically experience an increase in byproduct buildup between cleaning cycles. Hence, semiconductor wafers 105 processed immediately after the cleaning cycle is performed may have less particle contamination than semiconductor wafers 105 processed just prior to the performance of the cleaning cycle. If a particular lot passes through a deposition tool near the end of the time period between cleaning cycles, the particle contamination in a deposited process layer may be relatively high. This particle contamination may reduce the insulating properties of the process layer, resulting in a reduction in the anticipated grade of the devices produced from the semiconductor wafers 105 in the lot. The increased particle contamination may also result in a lower anticipated yield for the lot. However, if the lot of semiconductor wafers 105 is processed in a deposition tool just after the cleaning cycle is performed; its estimated grade and yield may increase. Similar effects on estimated grade and yield may result from the effects of processing in other processing tools 410.

Based upon the ranking performed by the lot disposition unit 340, a wafer reorganization unit 350 may provide data for reorganizing semiconductor wafers 105 within a particular lot. The wafer reorganization unit 350 provides data for the system 300 to re-order (e.g., re-arranging a sequence of wafers 105 in a lot) semiconductor wafers 105 within a particular lot. For example, semiconductor wafers 105 within a lot may be re-ordered within a container that transports semiconductor wafers 105 throughout a manufacturing facility (e.g., a wafer-cassette). The wafer reorganization unit 350 may reorganize semiconductor wafers 105 such that semiconductor wafers 105 in certain positions within the lot may be processed slightly differently within a particular processing tool 410. The wafer reorganization unit 350 provides an ordering scheme that promotes more uniform and/or efficient processing of the semiconductor wafers 105 within a particular lot.

In an alternative embodiment, the wafer reorganization unit 350 may provide reorganization of semiconductor wafers 105 from a plurality of lots, such that a new lot may be created. For example, the wafer reorganization unit 350, based upon the individual semiconductor wafers' 105 ranking provided by the lot disposition unit 340, may select various semiconductor wafers 105 that exhibit similar or related characteristics from a plurality of lots. The semiconductor wafers 105 that are selected from the multiple lots may reflect selected semiconductor wafers 105 upon which processes may be performed more efficiently, which may result in better yields, and/or other characteristics.

In one embodiment, the defect analysis unit 320, the lot disposition unit 340, and/or the wafer reorganization unit 350 may be a software, firmware, or hardware unit, which may be a standalone unit or may be integrated into a computer system associated with the process controller 310. Furthermore, the various components represented by the blocks illustrated in FIG. 3 may communicate with one another via a system communication line 315. The system communications line 315 may be a computer bus link, a dedicated hardware communications link, a telephone system communications link, a wireless communications link, or other communication links that may be implemented by those skilled in the art having benefit of the present disclosure.

Figure 4:
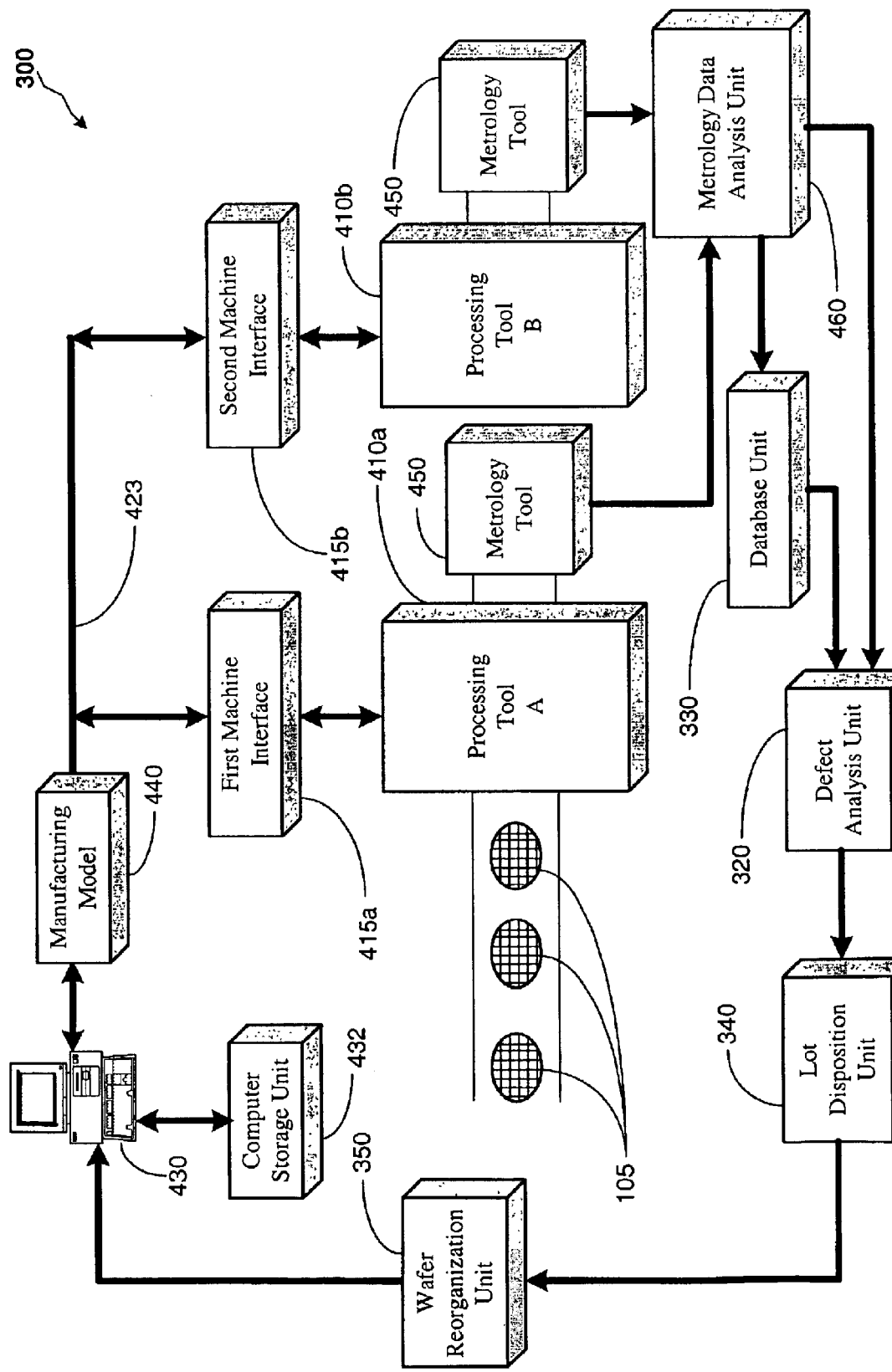
FIG. 4 illustrates a more detailed block diagram representation of the system shown in FIG. 3 in accordance with one illustrative embodiment of the present invention.

Turning now to FIG. 4, a more detailed block diagram of the system 300 in accordance with one embodiment of the present invention is illustrated. Semiconductor wafers 105 are processed on processing tools 410a, 410b using a plurality of control input signals, or manufacturing parameters, provided via a line or network 423. The control input signals, or manufacturing parameters, on the line 423 are sent to the processing tools 410a, 410b from a computer system 430 via machine interfaces 415a, 415b. The first and second machine interfaces 415a, 415b are generally located outside the processing tools 410a, 410b. In an alternative embodiment, the first and second machine interfaces 415a, 415b are located within the processing tools 410a, 410b. The semiconductor wafers 105 are provided to and carried from a plurality of processing tools 410. In one embodiment, semiconductor wafers 105 may be provided to a processing tool 410 manually. In an alternative embodiment, semiconductor wafers 105 may be provided to a processing tool 410 in an automatic fashion (e.g., robotic movement of semiconductor wafers 105). In one embodiment, a plurality of semiconductor wafers 105 is transported in lots (e.g., stacked in cassettes) to the processing tools 410.

In one embodiment, the computer system 430 sends control input signals, or manufacturing parameters, on the line 423 to the first and second machine interfaces 415a, 415b. The computer system 430 is capable of controlling processing operations. In one embodiment, the computer system 430 is a process controller. The computer system 430 is coupled to a computer storage unit 432 that may contain a plurality of software programs and data sets. The computer system 430 may contain one or more processors (not shown) that are capable of performing the operations described herein. The computer system 430 employs a manufacturing model 440 to generate control input signals on the line 423. In one embodiment, the manufacturing model 440 contains a manufacturing recipe that determines a plurality of control input parameters that are sent on the line 423 to the processing tools 410a, 410b.

In one embodiment, the manufacturing model 440 defines a process script and input control that implement a particular manufacturing process. The control input signals (or control input parameters) on the line 423 that are intended for processing tool A 410a are received and processed by the first machine interface 415a. The control input signals on the line 423 that are intended for processing tool B 410b are received and processed by the second machine interface 415b. Examples of the processing tools 410a, 410b used in semiconductor manufacturing processes are steppers, etch process tools, deposition tools, and the like.

One or more of the semiconductor wafers 105 that are processed by the processing tools 410a, 410b can also be sent to a metrology tool 450 for acquisition of metrology data. The metrology tool 450 may be a scatterometry data acquisition tool, an overlay-error measurement tool, a critical dimension measurement tool, and the like. In one embodiment, a metrology tool 450 examines one or more processed semiconductor wafers 105. The metrology data analysis unit 460 may collect, organize, and analyze data from the metrology tool 450. The metrology data is directed to a variety of physical or electrical characteristics of the devices formed across the semiconductor wafers 105. For example, metrology data may be obtained as to line width measurements, depth of trenches, sidewall angles, thickness, resistance, and the like. Metrology data may be used to determine faults that may be present across the processed semiconductor wafers 105, which may be used to quantify the performance of the processing tools 410.

The metrology data analysis unit 460 provides analyzed metrology data to be stored in the database unit 330. The defect analysis unit 320 may receive analyzed metrology data from the metrology data analysis unit 460. The defect analysis unit 320 may also receive defect data and data related to other characteristics of processed semiconductor wafers 105 from other lots from the database unit 330. The defect analysis unit 320 then performs a defect analysis based upon the data from the database unit 330 and/or the metrology data from the metrology data analysis unit 460. Based upon the analysis, the defect analysis unit 320 provides the resulting data to the lot disposition unit 340. As described above, the lot disposition unit 340 provides a semiconductor wafers' 105 ranking scheme to the wafer reorganization unit 350. Additionally, the semiconductor wafers 105 may be ranked as a result of maintenance activities. For example, semiconductor wafers 105 may be ranked by their position in the maintenance cycle of the processing tool 610. The wafer reorganization unit 350 may provide a feedback-type data to the computer system 430, which may implement wafer reorganization within a lot, as described above, and/or create a new lot by selecting semiconductor wafers 105 from a plurality of lots, as also described above.

Figure 5:
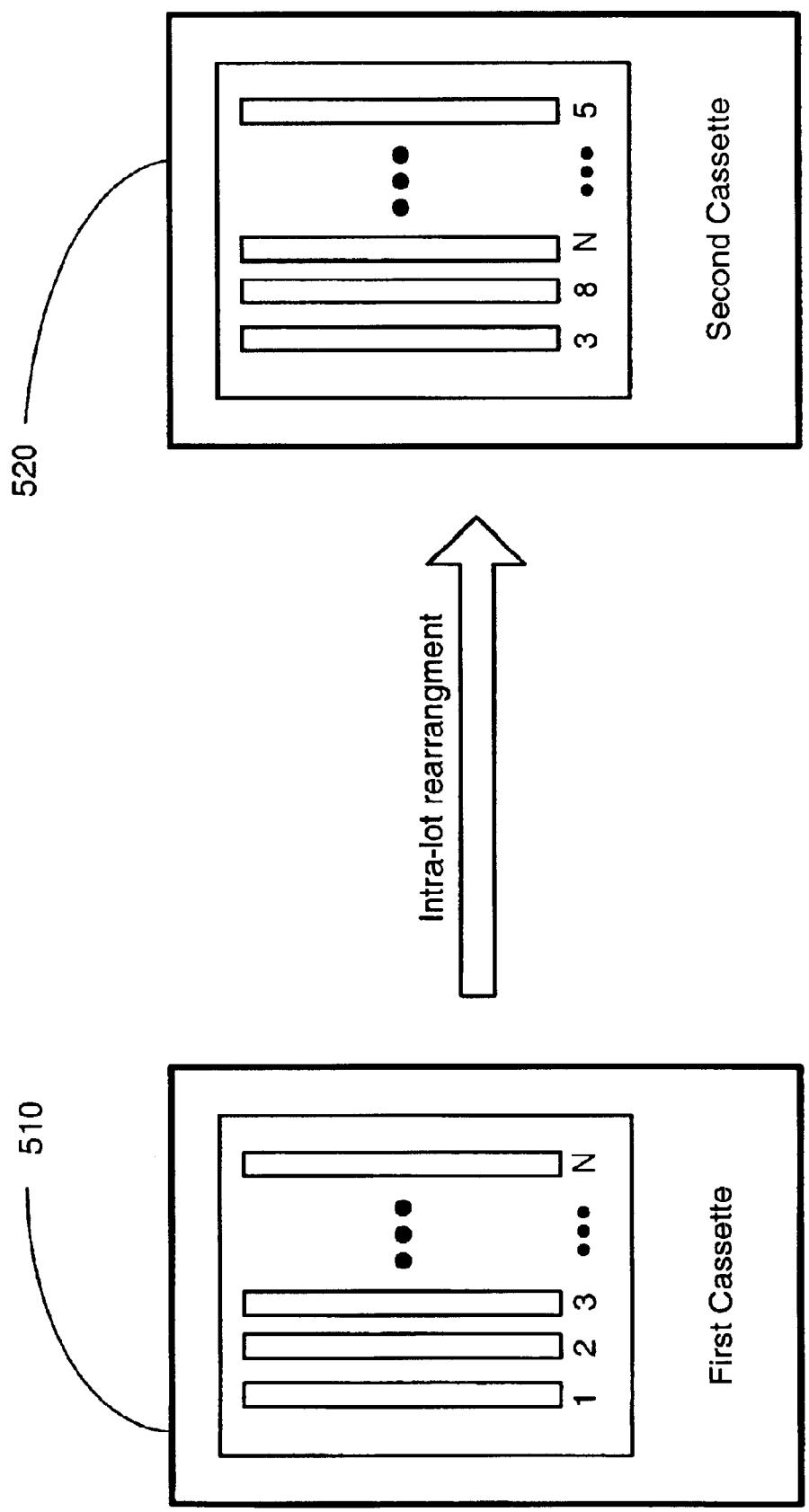
FIG. 5 is a block diagram representation of an intra-lot re-arrangement of semiconductor wafers, in accordance with one illustrative embodiment of the present invention.
Figure 6:
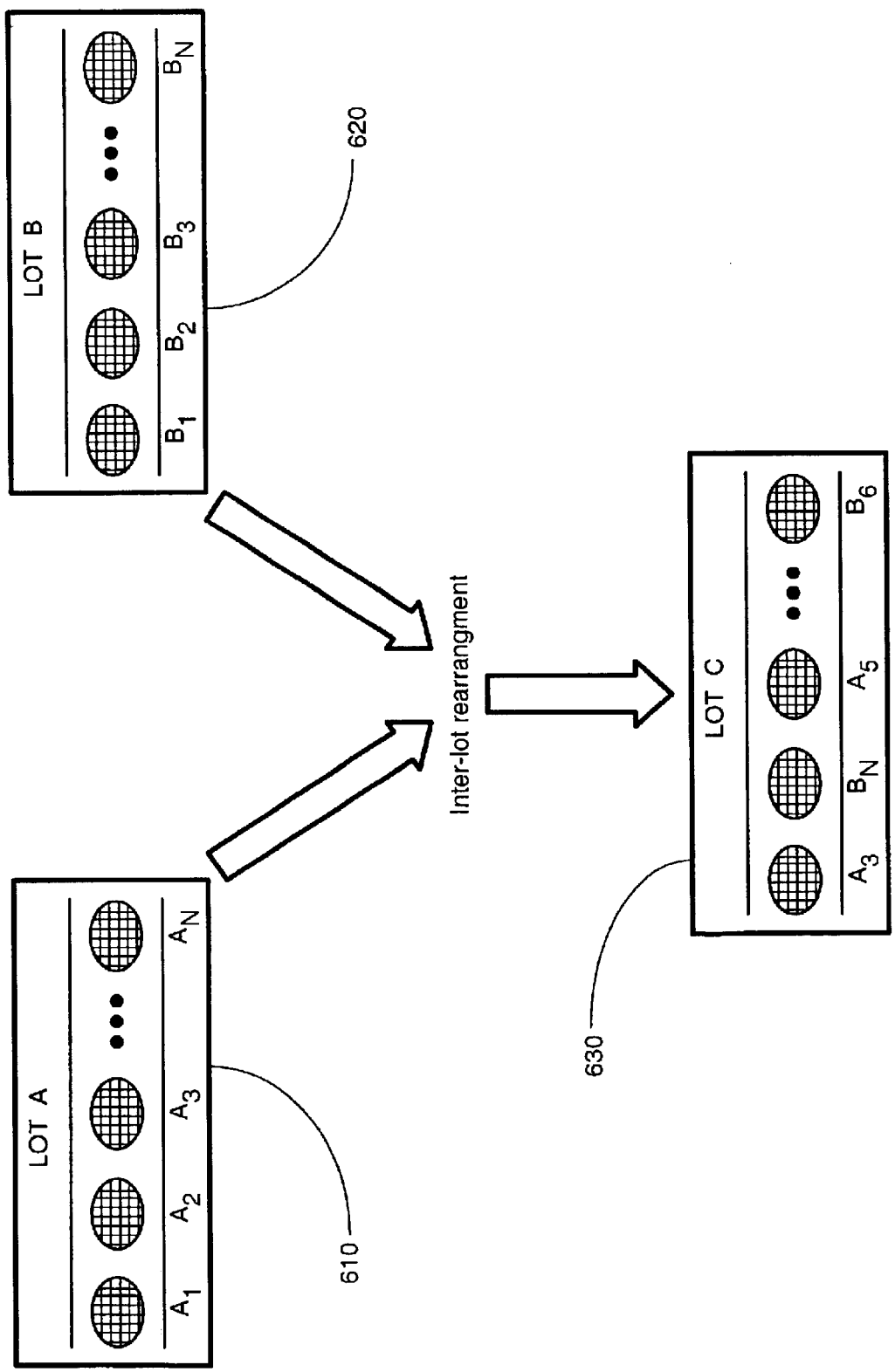
FIG. 6 is a block diagram representation of an inter-lot re-arrangement of semiconductor wafers, in accordance with one illustrative embodiment of the present invention.

Turning now to FIGS. 5 and 6, an intra-lot rearrangement scheme and an inter-lot rearrangement scheme as employed by the system 300 are, respectively, illustrated. In one embodiment, semiconductor wafers 105 are arranged in the order 1, 2, 3, ... N, in a first cassette 510 that routes the batch of semiconductor wafers 105 throughout the manufacturing facility. The semiconductor wafers 105 in the first cassette 510 may be rearranged by the wafer reorganization unit 350. The second cassette 520 illustrates an exemplary rearrangement of the semiconductor wafers 105 reorganized by the wafer reorganization unit 350. The semiconductor wafers 105 may be rearranged, such that more efficient processing of the batch of semiconductor wafers 105 may occur. In an alternative embodiment, the semiconductor wafers 105 may be rearranged and replaced in the first cassette 510. Rearrangement of the semiconductor wafers 105 within a particular lot as illustrated in FIG. 5 is an intra-lot rearrangement performed by the wafer reorganization unit 350.

As illustrated in FIG. 6, semiconductor wafers 105 from a plurality of lots may be selected to generate a new lot that contains selected semiconductor wafers 105 with similar or related characteristics, such as improved yield characteristics, grade parameter characteristics, reliability characteristics, and the like. For example, lot A 610 comprises semiconductor wafers $A_1, A_2, A_3, \ldots A_N$. Lot B 620 comprises semiconductor wafers $B_1, B_2, B_3, \ldots B_N$. Based upon the defect analysis and the semiconductor wafers 105 ranking system provided by the lot disposition unit 340, the wafer reorganization unit 350 may select particular semiconductor wafers 105, such as semiconductor wafers $A_3, B_N, A_5$, and $B_6$, to generate a new lot (lot C 630). Lot C 630 comprises semiconductor wafers 105 of superior characteristics, such as superior yield characteristics, and the like. Generating the new lot C 630 from selected wafers from lot A 610 and lot B 620 is an inter-lot rearrangement.

Figure 7:
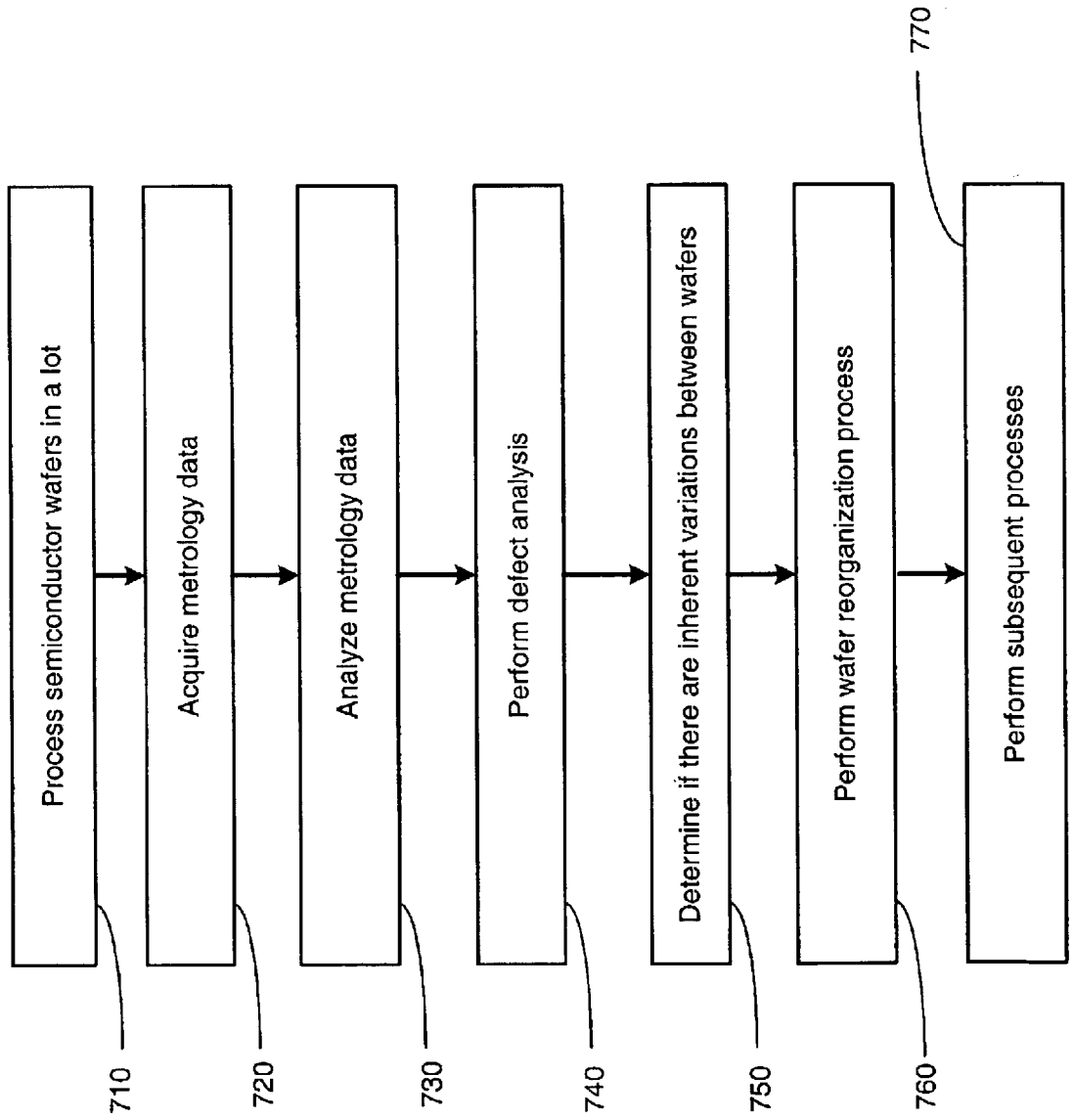
FIG. 7 illustrates a flowchart depiction of a method in accordance with one illustrative embodiment of the present invention.

Turning now to FIG. 7, a flowchart depiction of the methods for employing embodiments of the present invention is illustrated. The system 300 processes semiconductor wafers 105 within a lot (block 710). The system 300, after processing at least one semiconductor wafer 105, may acquire metrology data related to the processed semiconductor wafer 105 (block 720). The system 300 may analyze the metrology data in an inline fashion, such that metrology data related to the processed semiconductor wafer 105 is available for analysis during the manufacturing processes (block 730).

The system 300 may then perform a defect analysis based upon the metrology data and/or other data relating to the processed semiconductor wafers 105 (block 740). The defect analysis may comprise checking to see the total number of defects present on the processed semiconductor wafer 105, the type of defects, the severity of defects, the size of the defects, and the like. Furthermore, the system 300 may also determine if there are inherent variations between the semiconductor wafers 105 that may cause different responses to the same process performed on the semiconductor wafers 105 (block 750). Based upon the analysis of the defects, the inherent variations, and/or other characteristics associated with the semiconductor wafers 105, the system 300 may perform a wafer reorganization process (block 760).

The wafer reorganization process may result in the reorganization of semiconductor wafers 105 within a particular lot and/or reorganization and reassignment of semiconductor wafers 105 from a plurality of lots into a new lot. A more detailed illustration and description of the steps for performing the wafer reorganization process indicated in block 760 is provided in FIGS. 8 and 9, and accompanying description below. Upon completion of the wafer reorganization process, the reorganized lot or lots are sent through subsequent process steps (block 770). The completions of the steps indicated in FIG. 7 may lead to improved and more accurate and efficient processing of semiconductor wafers 105, which may result in devices with higher yields, improved grade parameters, reliability, and other physical characteristics.

Figure 8:
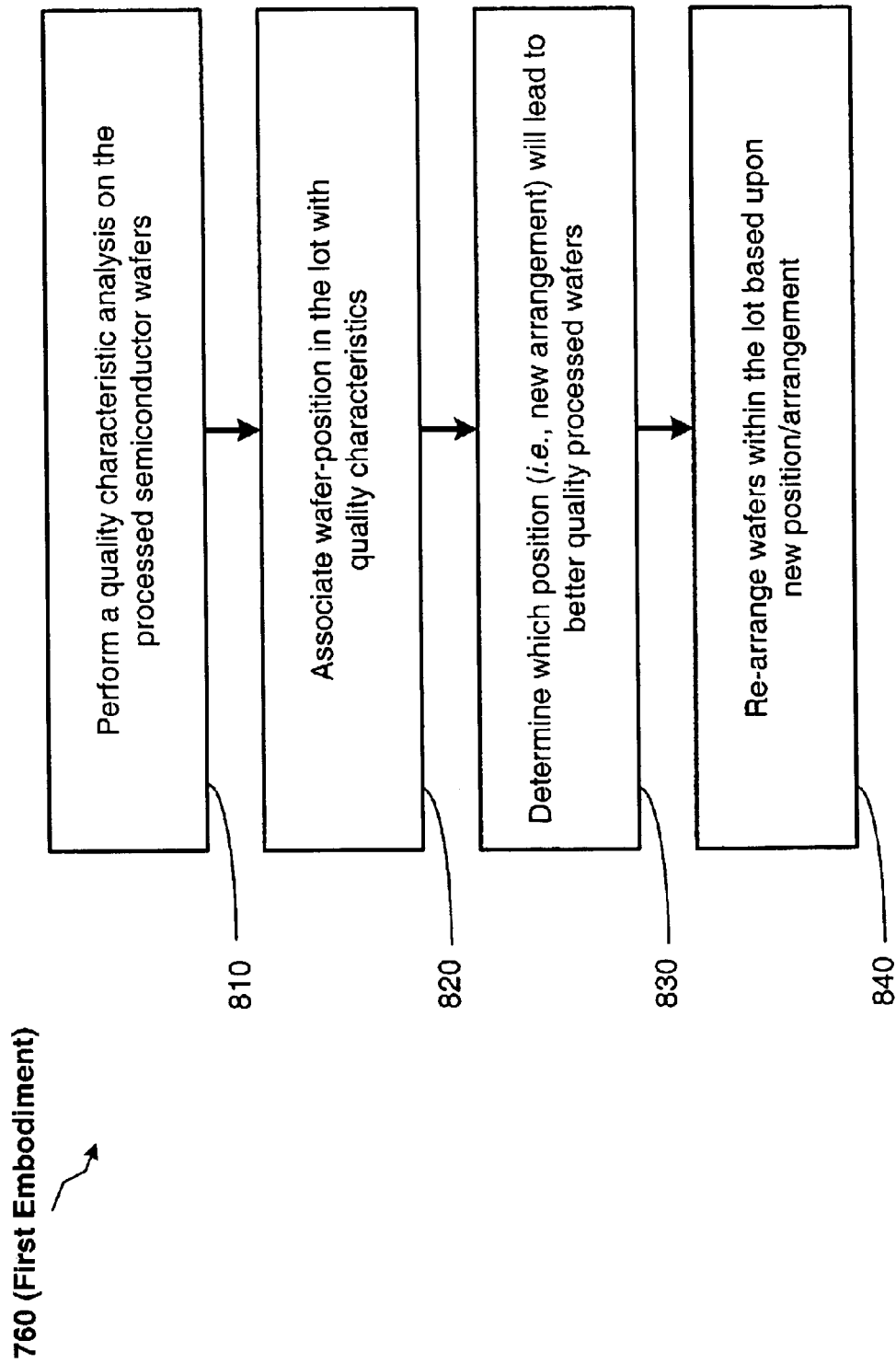
FIG. 8 illustrates a more detailed flowchart depiction of a method of performing a wafer reorganization process, as indicated in FIG. 7, in accordance with a first illustrative embodiment of the present invention.

Turning now to FIG. 8, a flow chart depiction of the steps for performing the wafer reorganization process indicated in block 760 of FIG. 7 is illustrated. The system 300, upon receiving data relating to the defect analysis and/or inherent variations of the semiconductor wafers 105, performs a quality characteristic analysis relating to the processed semiconductor wafers 105 (block 810). The quality characteristic analysis comprises quantifying the quality of semiconductor wafers 105 based upon one or more characteristics. This includes identifying semiconductor wafers 105 that may be processed in a more efficient and/or accurate manner, as compared to other semiconductor wafers 105, which may result in improved yields, improved grade parameters, improved reliability, and the like. The system 300 may then associate the position of particular semiconductor wafers 105 within a batch/lot, such as a cassette 510, 520, to the quality characteristics of the semiconductor wafers 105 (block 820). In other words, the system 300 determines which positions in the sequence of semiconductor wafers 105 in a batch/lot, is more desirable for certain processes.

Based upon the association of the position of semiconductor wafers 105 within a lot to the quality characteristics of the semiconductor wafers 105, the system 300 may determine a new arrangement/position that may lead to better quality of processed semiconductor wafers 105 (block 830). Based upon the new position/arrangement data determined by the system 300, the semiconductor wafers 105 within the lot/batch may be rearranged (block 840). The completion of the steps described in FIG. 8 substantially completes the process of performing the wafer reorganization process, as indicated in block 760 described in FIG. 7

Figure 9:
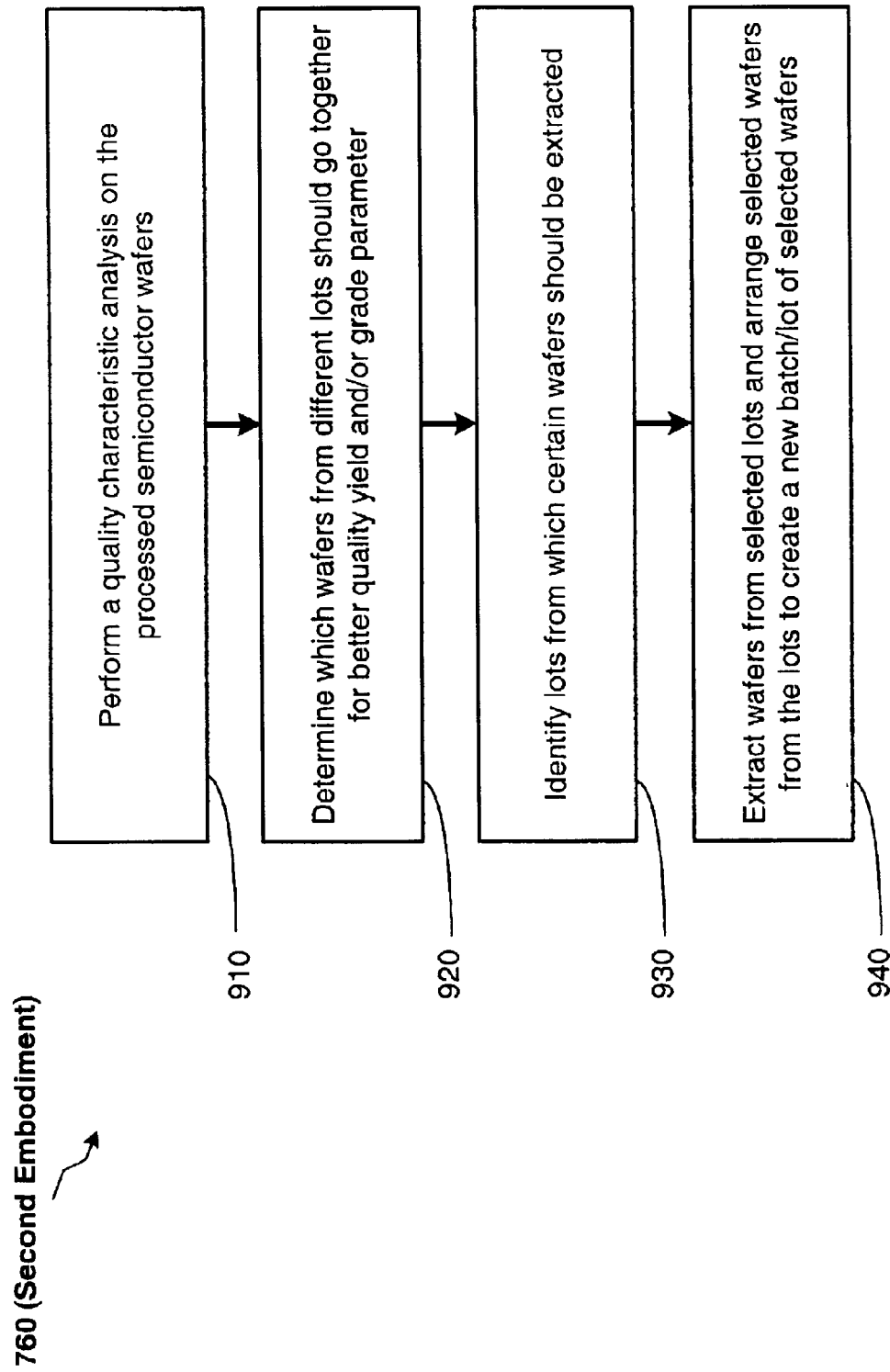
FIG. 9 illustrates a more detailed flowchart depiction of a method of performing a wafer reorganization process, as indicated in FIG. 7, in accordance with a second illustrative embodiment of the present invention.

Turning now to FIG. 9, a second embodiment of performing the wafer reorganization process as indicated in block 760 is illustrated in a flow chart depiction. Upon receiving data relating to the defect analysis and inherent variations of the semiconductor wafers 105, the system 300 performs a quality characteristic analysis (as described above) relating to the processed semiconductor wafers 105 (block 910). Based upon the quality characteristics determined by the system 300, the system 300 determines which semiconductor wafers 105 from different lots should be grouped together into a new lot for better quality yield, and/or grade parameter (s) (block 920). The system 300, then identifies lots from which particular semiconductor wafers 105 are to be extracted, based upon the semiconductor wafers' ranking scheme performed by the lot disposition unit 340 and the wafer reorganization unit 350 (block 930).

Once particular lots are identified from which certain selected semiconductor wafers 105 should be extracted, the extracted semiconductor wafers 105, upon capture from the selected lots, are arranged to create a new batch/lot of selected semiconductor wafers 105 (block 940). These selected semiconductor wafers 105, upon completion of processing, may lead to higher yield, higher grade parameter, reliability, and the like. The completion of the steps described in FIG. 9 substantially completes the second embodiment of performing the wafer reorganization process indicated in block 760 of FIG. 7.

Employing the methods, apparatus, system, computer programs provided by embodiments of the present invention, a superior lot of reorganized semiconductor wafers 105 may result, which may provide processed semiconductor wafers 105 that have improved characteristics such as higher yield, superior grade parameters, improved reliability, and the like. Furthermore, using embodiments of the present invention, a new lot that comprises superior semiconductor wafers 105, which may be extracted from a plurality of lots, is provided, such that higher yield, more efficient processing of superior semiconductor wafers 105 is possible. Utilizing embodiments of the present invention, more efficient, accurate semiconductor wafers 105 may be produced.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699 —Provisional Specification for CIM Framework Domain Architecture) and APC (SEMI E93-0999 —Provisional Specification for CIM Framework Advanced Process Control Component) specifications are publicly available from SEMI. The APC is a preferred platform from which to implement the control strategy taught by the present invention. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   acquiring metrology data associated with a processed semiconductor wafer in a lot;
   determining a quality characteristic associated with said processed semiconductor wafer based upon said metrology data; and
   re-organizing a plurality of semiconductor wafers associated with said lot for subsequent processing, based upon said determined quality characteristic, said re-organizing comprising arranging said semiconductor wafers in a sequence relating to said quality characteristic.

2. The method described in claim 1, wherein determining said quality characteristic associated with said processed semiconductor wafer based upon said metrology data further comprises determining at least one of an estimated yield parameter, an estimated grade parameter, an estimated power consumption parameter, a film resistivity parameter, a film capacitance parameter, a defect density parameter, and a feature dimension parameter.

3. The method described in claim 2, wherein determining said estimated grade parameter further comprises determining an estimated maximum clock speed of an operation of a device associated with said processed semiconductor wafer.

4. The method described in claim 2, wherein determining said quality characteristic associated with said processed semiconductor wafer based upon said metrology data further comprises:
   associating a position of said semiconductor wafer in a lot with at least one quality characteristic; and
   re-arranging the position of said semiconductor wafer based upon said association of said position of said semiconductor wafer to a quality characteristic.

5. The method described in claim 2, wherein determining said quality characteristic associated with said processed semiconductor wafer based upon said metrology data further comprises:
   determining a combination of semiconductor wafers from a plurality of lots based upon said metrology data; and
   arranging said combination of semiconductor wafer into a new lot for subsequent processing.

6. The method described in claim 5, wherein determining said combination of semiconductor wafers from a plurality of lots further comprises determining at least one inherent variation among a plurality of semiconductor wafers from said plurality of lots.

7. The method described in claim 5, wherein acquiring data relating to metrology data associated with said processed semiconductor wafer further comprises acquiring defect data relating to semiconductor wafers from a plurality of lots from a database.

8. The method described in claim 2, wherein re-organizing said plurality of semiconductor wafers associated with said lot for subsequent processing further comprises:
   performing a lot dispositioning function upon said lot, said lot dispositioning function comprising examining said metrology data and ranking said semiconductor wafers according to a quality characteristic; and
   re-arranging an order of processing associated with said semiconductor wafers in said lot, based upon said lot dispositioning function.

9. A method, comprising:
   acquiring metrology data associated with a plurality of processed semiconductor wafers associated with a plurality of lots;
   determining a quality characteristic associated with said processed semiconductor wafers based upon said metrology data; and
   determining a combination of semiconductor wafers from said plurality of lots based upon said quality characteristic; and
   arranging said combination of semiconductor wafers into a new lot for subsequent processing, said arranging comprising re-organizing said semiconductor wafers in a sequence relating to said quality characteristic.

10. The method described in claim 9, wherein determining a quality characteristic associated with said processed semiconductor wafers based upon said metrology data further comprises determining at least one of an estimated yield parameter, an estimated grade parameter, an estimated power consumption parameter, a film resistivity parameter, a film capacitance parameter, a defect density parameter, and a feature dimension parameter.

11. A method, comprising:
    processing a plurality of semiconductor wafers in a first lot, said semiconductor wafers being processed in an initial sequence;
    acquiring data relating to defects associated with said processed semiconductor wafers;
    determining a quality characteristic associated with said processed semiconductor wafers based upon said defects, said quality characteristic comprising at least one of an estimated yield parameter, an estimated grade parameter, an estimated power consumption parameter, a film resistivity parameter, a film capacitance parameter, a defect density parameter, and a feature dimension parameter; and
    re-configuring said initial sequence of said plurality of semiconductor wafers within said first lot for subsequent processing based upon said quality characteristic, said re-configuring comprising re-arranging said semiconductor wafers in a sequence relating to said quality characteristic.

12. The method described in claim 11, wherein re-configuring said initial sequence of said plurality of semiconductor wafers within said first lot further comprises:
    ranking said plurality of semiconductor wafers in said first lot based upon said quality characteristic; and
    re-arranging said sequence of said processing semiconductor wafers in said lot based upon said ranking.

13. The method described in claim 11, further comprising:
    processing semiconductor wafers associated with a second lot;

acquiring data relating to defects associated with said processed semiconductor wafers associated with said second lot;

determining a quality characteristic relating to said processed semiconductor wafers associated with said second lot; and generating a third lot of semiconductor wafers based upon said quality characteristics relating said semiconductor wafers associated with said first and second lot.

14. An apparatus, comprising:

means for acquiring data relating to at least one defect associated with a processed semiconductor wafer in a lot;

means for determining a quality characteristic associated with said processed semiconductor wafer based upon said defect; and means for re-organizing a plurality of semiconductor wafers associated with said lot for subsequent processing, based upon said quality characteristic.

15. A system, comprising:

a processing tool to process semiconductor wafers; and a process controller operatively coupled to said processing tool, said process controller to control operations of said processing tools and perform a wafer re-organization process, said wafer reorganization process comprising determining a quality characteristic associated with said semiconductor wafers and re-arranging a sequence of said processing of said semiconductor wafers based upon said quality characteristic, said re-arranging comprising re-organizing comprising re-organizing said semiconductor wafers in a sequence relating to said quality characteristic.

16. The system of claim 15, further comprising:

a metrology tool to acquire defect data relating to said semiconductor wafers;

a database operatively coupled to said process controller and said metrology tool, said database to store data relating to defect data relating to said semiconductor wafers;

a defect analysis unit operatively coupled with said process controller, said defect analysis unit to receive defect data from at least one of said database unit and said metrology tool and analyze said defect data;

a lot dispositioning unit operatively coupled to said defect analysis unit and said process controller, said lot dispositioning unit to perform a ranking function upon said semiconductor wafers, said ranking function comprising ranking said semiconductor wafers based upon said quality characteristic; and a wafer reorganization unit operatively coupled to said lot dispositioning unit and said process controller, said wafer reorganization unit to rearrange said sequence of processing said semiconductor wafers, based upon said ranking.

17. The system of claim 16, further comprising a computer system operatively coupled with said process controller, said computer system to implement said wafer reorganization function.

18. The system of claim 16, wherein said wafer reorganization unit being further adapted to generate a third lot by selecting a plurality of semiconductor wafers from a first lot and a second lot.

19. An apparatus, comprising:

a process controller, said process controller to control operations of at least one processing tool and perform a wafer re-organization process, said wafer reorganization process comprising determining a quality characteristic associated with said semiconductor wafers and re-arranging a sequence of said processing of said semiconductor wafers based upon said quality characteristics, said re-arranging comprising re-organizing said semiconductor wafers in a sequence relating to said quality characteristic.

20. The apparatus of claim 19, wherein said process controller further comprises:

a defect analysis unit, said defect analysis unit to receive defect data relating to said semiconductor wafers and analyze said defect data;

a lot dispositioning unit operatively coupled to said defect analysis unit, said lot dispositioning unit to perform a ranking function upon said semiconductor wafers, said ranking function comprising ranking said semiconductor wafers based upon said quality characteristic; and a wafer reorganization unit operatively coupled to said lot dispositioning unit, said wafer reorganization unit to rearrange said sequence of processing said semiconductor wafers, based upon said ranking.

21. A computer readable program storage device encoded with instructions that, when executed by a computer, performs a method, comprising:

acquiring metrology data associated with a processed semiconductor wafer in a lot;

determining a quality characteristic associated with said processed semiconductor wafer based upon said metrology data; and re-organizing a plurality of semiconductor wafers associated with said lot for subsequent processing, based upon said determined quality characteristic, said arranging comprising re-organizing said semiconductor wafers in a sequence relating to said quality characteristic.

22. The computer readable program storage device encoded with instructions that, when executed by a computer, performs the method described in claim 21, wherein determining said quality characteristic associated with said processed semiconductor wafer based upon said metrology data further comprises determining at least one of an estimated yield parameter, an estimated grade parameter, an estimated power consumption parameter, a film resistivity parameter, a film capacitance parameter, a defect density parameter, and a feature dimension parameter.

23. The computer readable program storage device encoded with instructions that, when executed by a computer, performs the method described in claim 22, wherein determining said estimated grade parameter further comprises determining an estimated maximum clock speed of an operation of a device associated with said processed semiconductor wafer.

24. The computer readable program storage device encoded with instructions that, when executed by a computer, performs the method described in claim 22, wherein determining said quality characteristic associated with said processed semiconductor wafer based upon said metrology data further comprises:

associating a position of said semiconductor wafer in a lot with at least one quality characteristic; and re-arranging the position of said semiconductor wafer based upon said association of said position of said semiconductor wafer to a quality characteristic.

25. The computer readable program storage device encoded with instructions that, when executed by a computer, performs the method described in claim 22, wherein determining said quality characteristic associated with said processed semiconductor wafer based upon said metrology data further comprises:

determining a combination of semiconductor wafers from a plurality of lots based upon said metrology data; and arranging said combination of semiconductor wafer into a new lot for subsequent processing.

26. The computer readable program storage device encoded with instructions that, when executed by a computer, performs the method described in claim 25, wherein determining said combination of semiconductor wafers from a plurality of lots further comprises determining at least one inherent variation among a plurality of semiconductor wafers from said plurality of lots.

27. The computer readable program storage device encoded with instructions that, when executed by a computer, performs the method described in claim 25, wherein acquiring metrology data associated with said processed semiconductor wafer further comprises acquiring metrology data relating to semiconductor wafers from a plurality of lots from a database.

28. The computer readable program storage device encoded with instructions that, when executed by a computer, performs the method described in claim 22, wherein re-organizing said plurality of semiconductor wafers associated with said lot for subsequent processing further comprises:

performing a lot dispositioning function upon said lot, said lot dispositioning function comprising examining said metrology data and ranking said semiconductor wafers according to a quality characteristic; and re-arranging an order of processing associated with said semiconductor wafers in said lot, based upon said lot dispositioning function.

29. A method, comprising:

acquiring metrology data associated with a processed semiconductor wafer in a lot;

determining a quality characteristic associated with said processed semiconductor wafer based upon said metrology data;

performing a lot dispositioning function upon said lot, said lot dispositioning function comprising examining said metrology data and ranking said semiconductor wafers according to a quality characteristic; and re-arranging an order of processing associated with said semiconductor wafers in said lot, based upon said lot dispositioning function.

30. The method described in claim 29, wherein determining said quality characteristic associated with said processed semiconductor wafer based upon said metrology data further comprises:

associating a position of said semiconductor wafer in a lot with at least one quality characteristic; and re-arranging the position of said semiconductor wafer based upon said association of said position of said semiconductor wafer to a quality characteristic.

31. The method described in claim 29, wherein determining said quality characteristic associated with said processed semiconductor wafer based upon said metrology data further comprises:

determining a combination of semiconductor wafers from a plurality of lots based upon said metrology data; and arranging said combination of semiconductor wafer into a new lot for subsequent processing.

32. The method described in claim 31, wherein determining said combination of semiconductor wafers from a plurality of lots further comprises determining at least one inherent variation among a plurality of semiconductor wafers from said plurality of lots.

33. The method described in claim 31, wherein acquiring data relating to metrology data associated with said processed semiconductor wafer further comprises acquiring defect data relating to semiconductor wafers from a plurality of lots from a database.

34. An apparatus, comprising:

a process controller, said process controller to control operations of at least one processing tool and perform a wafer reorganization process, said wafer reorganization process comprising determining a quality characteristic associated with a plurality of semiconductor wafers, ranking said semiconductor wafers according to said quality characteristic; and re-arranging an order of processing associated with said semiconductor wafers in said lot, based upon said lot ranking.

\* \* \* \* \*

UNITED STATES PATENT AND TRADEMARK OFFICE
CERTIFICATE OF CORRECTION

PATENT NO. : 6,799,311 B1
DATED : September 28, 2004
INVENTOR(S) : Matthew Ryskoski It is certified that error appears in the above-identified patent and that said Letters Patent is hereby corrected as shown below:

Column 4,
Line 45, replace "developers'specific" with -- developers' specific --.

Column 6,
Line 42, replace "wafers'105" with -- wafers' 105 --.

Column 8,
Line 10, replace "wafers'105" with -- wafers' 105 --.

Column 9,
Line 59, insert a period after "Figure 7."

Column 13,
Line 31, delete the second "comprising re-organizing,"

Column 14,
Line 7, replace "characteristics" with -- characteristic --.

Signed and Sealed this

Twenty-sixth Day of April, 2005

JON W. DUDAS
*Director of the United States Patent and Trademark Office*